United States Patent
Nakano et al.

(10) Patent No.: US 9,464,352 B2
(45) Date of Patent: Oct. 11, 2016

(54) LOW-OXIDATION PLASMA-ASSISTED PROCESS

(71) Applicant: ASM IP Holding B.V., Almere (NL)

(72) Inventors: Ryu Nakano, Sagamihara (JP); Naoki Inoue, Hachioji (JP); Kunitoshi Namba, Machida (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/268,348

(22) Filed: May 2, 2014

(65) Prior Publication Data

US 2015/0315704 A1    Nov. 5, 2015

(51) Int. Cl.
| C23C 16/455 | (2006.01) |
| C23C 16/505 | (2006.01) |
| C23C 16/40 | (2006.01) |
| C23C 16/52 | (2006.01) |
| H01J 37/32 | (2006.01) |
| H01L 21/02 | (2006.01) |
| H01L 21/033 | (2006.01) |

(52) U.S. Cl.
CPC ......... *C23C 16/45538* (2013.01); *C23C 16/40* (2013.01); *C23C 16/402* (2013.01); *C23C 16/505* (2013.01); *C23C 16/52* (2013.01); *H01J 37/32137* (2013.01); *H01J 37/32146* (2013.01); *H01L 21/0228* (2013.01); *H01L 21/02164* (2013.01); *H01L 21/02175* (2013.01); *H01L 21/02211* (2013.01); *H01L 21/02219* (2013.01); *H01L 21/02274* (2013.01); *H01L 21/0337* (2013.01)

(58) Field of Classification Search
None
See application file for complete search history.

(56) References Cited

U.S. PATENT DOCUMENTS

| 2001/0020715 A1* | 9/2001 | Yamasaki ......... H01L 21/76843 257/310 |
| 2004/0009307 A1* | 1/2004 | Koh ..................... C23C 16/34 427/569 |
| 2007/0111545 A1* | 5/2007 | Lee et al. ..................... 438/787 |
| 2010/0285319 A1* | 11/2010 | Kwak et al. ................ 428/411.1 |
| 2012/0028454 A1* | 2/2012 | Swaminathan ....... C23C 16/045 438/558 |

OTHER PUBLICATIONS

Article in the ECS Transactions, 53 (1) 321-329 (2013) 10.1149/05301.0321ecst, The Electrochemical Society, entitled, Characterstics of Low Temperature High Quality Silicon Oxide by Plasma Enhanced Atomic Layer Deposition With In-situ Plasma Densification Process by Haiwon Kim, Sergey N. Zaretskiy, Seungwoo Shin, Wooduck Jung, Ryong Hwang, Choonsik Jeong, Seongjin Park, Hanna Hwang, and Ilsub Chung, College of Information and Communication Engineering, Sungkyunkwan University, Suwon 440-746, Korea, Research and Development group.

* cited by examiner

*Primary Examiner* — Joseph Miller, Jr.
(74) *Attorney, Agent, or Firm* — Snell & Wilmer LLP (57) ABSTRACT

A method for forming an oxide film by plasma-assisted cyclic processing, includes: (i) supplying a precursor to a reaction space wherein a substrate is placed; (ii) applying a first RF power to the reaction space for a first period of time without supplying a precursor; and (iii) applying a second RF power to the reaction space for a second period of time without supplying the precursor, wherein the first RF power is lower than the second RF power, and/or the first period of time is shorter than the second period of time.

14 Claims, 8 Drawing Sheets
(1 of 8 Drawing Sheet(s) Filed in Color)

LOW-OXIDATION PLASMA-ASSISTED PROCESS

BACKGROUND OF THE INVENTION

1. Field of the Invention

The present invention generally relates to a method for forming an oxide film of a metal or silicon by plasma-assisted processing such as plasma-enhanced atomic layer deposition (PEALD).

2. Description of the Related Art

In a PEALD process, depending on the type of application, there are problems to be solved, such as oxidation of an underlying layer. Conventionally, this problem has been handled by lowering RF power. However, when RF power is lowered, desired properties of films such as thickness, uniformity, and wet etch rate, etc. cannot be obtained.

Figure 1A:
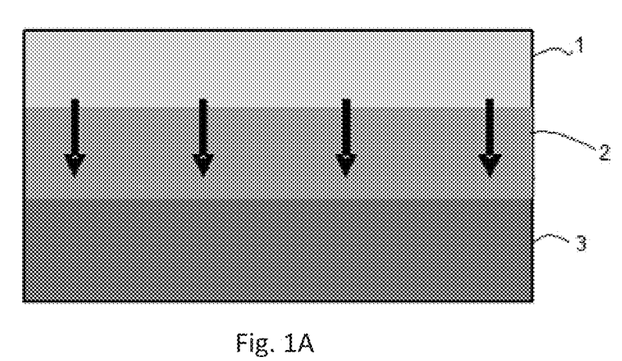
FIG. 1A is a schematic cross section of a partially fabricated integrated circuit, showing a SiO process.

For example, low RF power is required in a SiO process where oxidation of an underlying layer 3 is undesired because, as illustrated in FIG. 1A when high RF power is applied, the underlying layer 3 is oxidized due to the effects of oxygen plasma, ion bombardment, and sputtering during film deposition. That is, when a SiO film 1 is deposited by PEALD on the underlying layer 3 in which W, TiN, or other materials are contained or which is a SiN film, the material constituting the underlying layer 3 is oxidized in an upper portion 2 thereof by a plasma including oxidizing gas used for deposition of the SiO film 1, and thereby desired device characteristics cannot be obtained.

Figure 1B:
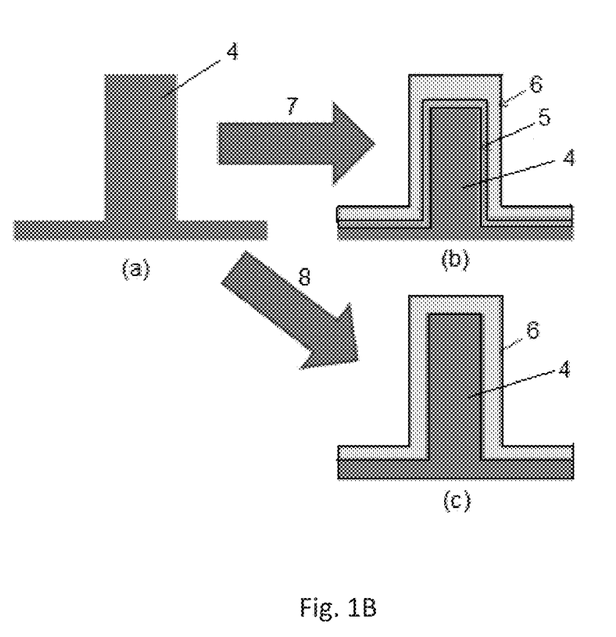
FIG. 1B consists of (a), (b), and (c) showing hyperfine processing such as a process for an FinFET (a nonplanar, double-gate transistor built on an SOI substrate).

Further, in hyperfine processing such as a process for an FinFET (a nonplanar, double-gate transistor built on an SOI substrate), as illustrated in FIG. 1B, a Si protrusion pattern 4 having a height of 6 nm is subjected to PEALD as shown in (a). When PEALD is performed under highly oxidizing conditions 7, the surface 5 of the protrusion pattern 4 is oxidized and eroded while a SiO film 6 is deposited by PEALD, thereby reducing the size of the protrusion pattern 4, particularly in a vertical direction (the height of the protrusion pattern 4 is reduced to 4 nm, for example) as shown in (b). As a result, the dimensions of the pattern are changed, and the deigned electronic properties may not be obtained. In contrast, when PEALD is performed under low oxidizing conditions 8, the surface of the protrusion pattern 4 is not significantly oxidized while a SiO film 6 is deposited by PEALD, thereby preventing a size reduction of the protrusion pattern 4, particularly in a vertical direction (the height of the protrusion pattern 4 can remain at 6 nm) as shown in (c).

Figure 1C:
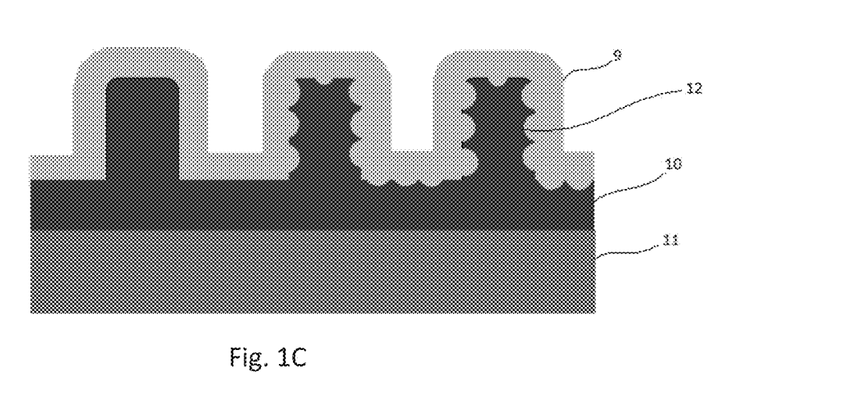
FIG. 1C is a schematic cross section of a partially fabricated integrated circuit, showing a process of depositing a film on a photoresist.

In addition, low RF power is required in a process of film deposition on a photoresist because, as illustrated in FIG. 1C when high RF power is applied during the film deposition process, the photoresist dimensions are set back and reduced due to the effects of oxygen plasma, ion bombardment, and sputtering. That is, when an oxide 9 is deposited by PEALD on a patterned photoresist 10 formed on a substrate 11 in a double patterning process, a portion 12 of the underlying photoresist 10 is oxidized and eroded by a plasma including oxidizing gas used for deposition of the SiO film 9, and the desired dimensions of the photoresist 10 cannot be obtained.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

In a first embodiment which can solve at least one of the above problems, an oxide film consists of multiple layers constituted by a combination of a bulk film and a protective film, wherein the bulk film is a film which is deposited to satisfy uniformity, film profile, and film quality designed for target application without imposing restrictions on RF power and/or oxidation conditions, and the protective film is a film which is deposited using low RF power prior to deposition of a bulk film. In a second embodiment which can solve at least one of the above problems, an oxide film is deposited by repeating at least one low-oxidation cycle using low RF power and at least one non-oxidation cycle using high RF power, thereby maintaining good film quality and also suppressing oxidation of an underlying layer.

In the first embodiment, at the beginning of depositing an oxide film, a protective film is formed as an initial film using low RF power, and then continuously, a film is deposited until the thickness of the film reaches a target value, said film designed to satisfy film uniformity, film profile, and film quality required for the target application. In some embodiments, the initial film is deposited by a plasma generated by low RF power such as less than 100 W for a 300-mm wafer, whereas the target film is deposited by a plasma generated by high RF power such as 100 W to 800 W for a 300-mm wafer. The final film is constituted by a combination of the protective film and the target film, wherein the minimum thickness of the protective film is about 2 nm. In some embodiments, the process temperature is in a range of about 50° C. to about 400° C., which is a controllable range by an aluminum susceptor of electrically-heated wire type. In some embodiments, the distance between the electrodes is in a range of about 7 mm to about 15 mm. According to the first embodiment, both improving the film quality and suppressing oxidation of an underlying film can be achieved. Further, a reduction of productivity can be minimized even if low oxidation processing is conducted.

In the second embodiment, a film is deposited by repeating PEALD cycles constituted by a low-power low-oxidation cycle and a high-power non-oxidation cycle, thereby obtaining desired film quality and suppressing oxidation of an underlying film. In some embodiments, a first plasma treatment step using a gas system including oxygen and a second plasma treatment step using a gas system including no oxygen are performed under particular conditions. In some embodiments, the flow rate of an oxidizing agent in the first step is about 500 sccm to 2,000 sccm per reaction chamber, whereas no oxidizing gas is supplied in the second step. In some embodiments, the process temperature is in a range of about 50° C. to about 400° C., which is a controllable range by an aluminum susceptor of electrically-heated wire type. In some embodiments, the process pressure is in a range of about 200 Pa to about 500 Pa, so as to promote ignition of a plasma even at low radio-frequency power and to be good purge efficiency. RF power in the first step is as low as about 30 W to about 100 W for a 300-mm wafer so as to suppress oxidation of the underlying film, and RF power in the second step is in a range of about 100 W to about 800 W for a 300-mm wafer, which is higher than the range in the first step, because no oxidizing is included in the second step. In some embodiments, the distance between the electrodes is in a range of about 7 mm to about 15 mm. In some embodiments, the duration of application of RF power per cycle varies depending on the target film quality, and it is in a range of about 0.1 seconds to about 1.5 seconds in the first step, whereas it is at least 0.1 seconds. According to the second embodiment, both maintaining high film quality and suppressing oxidation of an underlying film can be achieved. Further, unlike with post treatment (i.e., surface treatment), not only the surface but also portions deep inside can maintain high film quality uniformly in the thickness direction by repeating the first and second steps alternately. Additionally, the film quality can be controlled by changing a ratio of the cycle numbers of the first and second steps and/or a ratio of the duration of application of RF power in the first step and that in the second step, without changing RF power through the first and second steps.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

In this disclosure, "gas" may include vaporized solid and/or liquid and may be constituted by a single gas or a mixture of gases. Likewise, an article "a" or "an" refers to a species or a genus including multiple species. In this disclosure, a process gas introduced to a reaction chamber through a showerhead may be comprised of, consist essentially of, or consist of a metal- or silicon-containing precursor and a reactant gas. The reactant gas includes a gas for oxidizing the precursor when RF power is applied to the reactant gas. The precursor and the reactant gas can be introduced separately to a reaction space. The precursor can be introduced with a carrier gas such as a rare gas. A gas other than the process gas, i.e., a gas introduced without passing through the showerhead, may be used for e.g., sealing the reaction space, which includes a seal gas such as a rare gas. In some embodiments, "film" refers to a layer continuously extending in a direction perpendicular to a thickness direction substantially without pinholes to cover an entire target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. The term "constituted by" refers to "comprising", "consisting essentially of", or "consisting of" in some embodiments. Further, in this disclosure, any two numbers of a variable can constitute an workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

In some embodiments, as method for forming an oxide film by plasma-assisted cyclic processing, comprises: (i) supplying a precursor to a reaction space wherein a substrate is placed; (ii) applying a first RF power to the reaction space for a first period of time without supplying a precursor; and (iii) applying a second RF power to the reaction space for a second period of time without supplying a precursor, wherein the first RF power is lower than the second RF power, and/or the first period of time is shorter than the second period of time. In some embodiments, the oxide film is a film having substantially uniform compositions in a thickness direction and is considered to be a single film based on uniformity and/or continuity of compositions. Further, the "oxide film" may refer to a film characterized by M-O bonds (M is a metal or silicon), constituted mainly or predominantly by M-O bonds, categorized in Mi-O films, and/or having a main skeleton substantially constituted by Mi-O bonds. When a precursor having hydrocarbons such as organoaminosilane is used, the oxide film may contain carbons derived from the precursor. In some embodiments, the oxide film may contain C, H, and/or N as a minor element.

In some embodiments, the oxide film is constituted by a first oxide layer and a second oxide layer, wherein steps (i) and (ii) without step (iii) constitute a first cycle, and by repeating the first cycle, the first oxide layer is formed on the substrate, and wherein steps (i) and (iii) without step (ii) constitute a second cycle, and by repeating the second cycle, the second oxide layer is formed on top of the first oxide film, said precursors used in the first and second cycles being the same. In some embodiments, the first oxide layer and the second oxide layer are continuously formed, wherein the oxide film is constituted by substantially uniform compositions in a thickness direction. In this disclosure, the first oxide layer may also be referred to as "a protective layer" or "an initial layer", and the second oxide layer may be referred to as "a target oxide layer".

In some embodiments, step (ii) is controlled so that the first oxide layer has a film profile showing a thickness of the first oxide layer which is thicker at a center of the first oxide layer than along a periphery of the first oxide layer, and step (iii) is controlled so that the second oxide layer has a film profile showing a thickness of the second oxide layer which is thicker along a periphery of the second oxide layer than at a center of the second oxide layer. Since the first oxide layer is deposited using lower RF power and/or shorter application of RF power in step (ii) than in step (iii), oxidation of the underlying film can effectively be inhibited, and the first oxide layer protects the underlying film from oxidation when the second oxide layer is deposited. Thus, the first oxide layer functions as a protective layer. Further, the first oxide layer is deposited using lower RF power and/or shorter application of RF power in step (ii) than in step (iii), the film profile of the first oxide layer tends to show a thick center and a thin periphery, i.e., a convex cross section, whereas the film profile of the second oxide layer tends to show a thick periphery and a thin center, i.e., a concave cross section. In some embodiments, the second oxide layer is thicker than the first oxide layer, and the oxide film has a film profile showing a thickness of the oxide film which is thicker at a center and along a periphery of the oxide film than in an area between the center and the periphery. By selecting the thickness of the first and second oxide layers, the film profile of the target oxide film can be manipulated. In this disclosure, the thickness of a film, or layer refer to an average thickness of the film or layer which is determined by measuring a thickness of the film or layer at randomly selected multiple points of the film or layer.

In some embodiments, the first cycle is repeated until the first oxide layer has a thickness of about 2 nm or more (e.g., 3 nm, 5 nm, 7 nm, 10 nm, 15 nm, 20 nm, 30 nm, or a value between any of the foregoing numbers). In some embodiments, the thickness of the first oxide layer is about 20 nm or less. When the first oxide layer has the above thickness, it effectively functions as a protective layer (protecting the underlying film from oxidation).

In some embodiments, an oxidizing gas is continuously supplied to the reaction chamber throughout step (i), step (ii), and step (iii). When the steps are continuously conducted, no interface is formed between the first and second oxide layers, maintaining good continuity. In some embodiments, after the first oxide layer is formed and before the second oxide layer is formed, the first oxide layer may be exposed to ambient air. In that case, an interface between the first and second oxide layers can be detected. However, the detected level is immaterial and unsubstantial, and the oxide film constituted by the first and second oxide layers is considered to be a single film. Further, productivity is improved. In this disclosure, "continuously" refers to without breaking a vacuum, without interruption as a timeline, without changing treatment conditions, immediately thereafter, as a next step, or without a discrete physical or chemical boundary between two structures in some embodiments.

In some embodiments, the first RF power is no more than about 0.14 W/cm$^2$ (Wattage per unit area of the substrate) (e.g., 0.05 W/cm$^2$, 0.07 W/cm$^2$, 0.10 W/cm$^2$, or a value between any of the foregoing numbers) and the second RF power is no less than about 0.14 W/cm$^2$ but no more than about 1.13 W/cm$^2$ (e.g., 0.20 W/cm$^2$, 0.50 W/cm$^2$, 1.00 W/cm$^2$, or a value between any of the foregoing numbers). In some embodiments, in addition to the above or in the alternative, the first period of time for applying RF power is about 0.1 seconds to about 1.5 seconds (e.g., 0.2 seconds, 0.5 seconds, 1.0 seconds, or a value between any of the foregoing numbers), and the second period of time for applying RF power is longer than the first period of time. In some embodiments, the first RF power and the second RF power are the same, and the first period of time for applying RF power is shorter than the second period of time for applying RF power. In some embodiments, the first RF power is lower than the second RF power, and the first period of time for applying RF power is the same as the second period of time for applying RF power. Preferably, both RF power and application time are adjusted to effectively inhibit oxidation of the underlying layer, and to obtain a desired final oxide film.

As the precursor, for SiO film, for example, organoaminosilanes can be used, including bis(diethylamino)silane (BDEAS or SAM24), tetrakis(dimethylamino)silane (4DMAS), tris(dimethylamino)silane (3DMAS), bis(dimethylamino)silane (2DMAS), tetrakis(ethylmethylamino)silane (4EMAS), tris(ethylmethylamino)silane (3EMAS), bis(tertiary-butylamino)silane (BTBAS), and bis(ethylmethylamino)silane (BEMAS), singly or in any combination of two or more. In some embodiments, the precursor consists essentially of any of the foregoing compounds. The term "consisting essentially of" is used to the full extent permitted by law and regulation.

In some embodiments, the plasma is generated using $O_2$, $C_xO_y$, and/or $N_xO_y$, with or without a rare gas. As $C_xO_y$, CO, $C_2O$, $CO_2$, $C_3O_2$, $CO_3$, and $C_5O_2$ can be used singly or in any combination of two or more. As $N_xO_y$, NO, $N_2O$, $NO_2$, $N_2O_3$, $N_2O_4$, and $N_2O_5$ can be used singly or in any combination of two or more.

As a carrier gas, seal gas, purge gas, or process-adjustment gas (auxiliary gas), a rare gas such as Ar, He, Ne, Kr, and Xe can be used, singly or in any combination of two or more.

In some embodiments, steps (i) to (iii) are conducted at a temperature of about 50° C. to about 400° C., and the first and second RF powers are charged between electrodes which are distanced by about 7 mm to 15 mm, between which the substrate is placed. In some embodiments, the plasma-assisted cyclic processing is plasma-enhanced atomic layer deposition (PEALD).

In some embodiments, the first oxide layer can be deposited under the following conditions, although the conditions may vary depending on the type of oxide film:

TABLE 1

(the numbers are approximate)

| | Preferably | Typically |
|---|---|---|
| Precursor | BDEAS | |
| Precursor partial pressure in Carrier gas | 2%-20% | 5-10% |
| Carrier gas | Ar, N$_2$, He | Ar |
| Flow rate of carrier gas (continuous) | 500 sccm-4000 sccm | 2000 sccm |
| Reactant gas | O2, CO$_2$, N$_2$O | O$_2$ |
| Flow rate of reactant gas (continuous) | 500 sccm-6000 sccm | 1000-2000 sccm |
| Dilution gas | Ar, N$_2$, He | Ar, He |
| Flow rate of dilution gas (continuous) | 0 sccm-4000 sccm | 2000 sccm |
| Susceptor temperature | 50° C.-400° C. | 75° C.-300° C. |
| Pressure | 200 Pa-600 Pa | 400 Pa |
| RF power (13.56 MHz) | 10 W to 100 W (300-mm tool) (for stable ignition, at least 30 W) | 50 W |
| Precursor supply time | 0.1 sec.-1.0 sec. | 0.2 sec |
| Purge time after precursor pulse | 0.1 sec.-2.0 sec. | 0.3 sec |
| RF plasma exciting time | 0.1 sec.-1.0 sec. | 0.2 sec |
| Purge time after RF application | 0.1 sec.-0.5 sec. | 0.1 sec |
| Number of cycles | Depending on the target thickness | |
| Thickness of film | 2 nm-50 nm (depending on the application, target properties) | 30 nm |
| In-plane uniformity (convex profile) (10%) | 0.2-1.0 | |

In some embodiments, the second oxide layer can be deposited under the following conditions, although the conditions may vary depending on the type of oxide film:

TABLE 2

(the numbers are approximate)

| | Preferably | Typically |
|---|---|---|
| Precursor | BDEAS | |
| Precursor partial pressure in Carrier gas | 2%-20% | 5-10% |
| Carrier gas | Ar, N$_2$, He | Ar |
| Flow rate of carrier gas (continuous) | 500 sccm-4000 sccm | 2000 sccm |
| Reactant gas | O2, CO$_2$, N$_2$O | O$_2$ |
| Flow rate of reactant gas (continuous) | 500 sccm-6000 sccm | 1000-2000 sccm |
| Dilution gas | Ar, N$_2$, He | Ar, He |
| Flow rate of dilution gas (continuous) | 0 sccm-4000 sccm | 2000 sccm |
| Susceptor temperature | 50° C.-400° C. | 75° C.-300° C. |
| Pressure | 200 Pa-600 Pa | 400 Pa |
| RF power (13.56 MHz) | 100 W to 800 W (300-mm tool) | 500 W |
| Precursor supply time | 0.1 sec.-1.0 sec. | 0.2 sec |
| Purge time after precursor pulse | 0.1 sec.-2.0 sec. | 0.3 sec |
| RF plasma exciting time | 0.1 sec.-5.0 sec. | 1.0 sec |
| Purge time after RF application | 0 sec.-0.5 sec. | 0.1 sec |
| Number of cycles | Depending on the target thickness | |
| Thickness of film | Depending on the target thickness | |
| In-plane uniformity (concave profile) (10%) | 0.2-1.0 | |

In some embodiments, the first oxide layer and the second oxide layer can continuously be formed by changing RF power application only. In other embodiments, the first oxide layer and the second oxide layer can continuously be formed by changing not only RF power application but also gas supply conditions, having a transition period where the gas flow may be changed gradually and continuously.

In other embodiments, the oxide film is constituted by multiple sub-oxide layers, wherein steps (i), (ii), and (iii) constitute a cycle, and by repeating the cycle, multiple sub-oxide layers are formed on the substrate, wherein in step (ii), an oxidizing gas is supplied, and in step (iii), no oxidizing gas is supplied. In the above embodiments, in place of the protective layer, by using multiple sub-oxide layers, oxidation of the underlying layer can effectively be inhibited, wherein each sub-layer is deposited under low-oxidation conditions where RF power is low and/or the duration of RF power application is short, followed by a non-oxygen plasma treatment cycle under conditions where RF power is high and/or the duration of RF power is longer. The deposition conditions and plasma treatment conditions for the multiple sub-oxide layers can be substantially similar to or the same as those for the protective layer and the target layer described earlier except the conditions specifically described below.

In some embodiments, the cycle for forming a target oxide film (also referred to as "Z cycle") is constituted by at least one first sub-cycle (also referred to as "X cycle") and at least one second sub-cycle (also referred to as "Y cycle"), each first sub-cycle being constituted by steps (i) and (ii) without step (iii), each second sub-cycle being constituted by step (iii) without steps (i) and (ii). In some embodiments, each first sub-cycle deposits a sub-layer constituting the oxide film, and each second sub-cycle deposits no sub-layer. In the above, the second sub-cycle is a non-oxygen plasma surface treatment without depositing any film or layer. When in the second sub-cycle, no precursor is supplied to the reaction space, and the cycle functions as a surface plasma treatment which can effectively densify the sub-layer and improve the film properties. As a result of densification due to the second sub cycle, the thickness of the sub-layer is reduced.

In some embodiments, the cycle (Z cycle) is constituted by at least one first sub-cycle (X cycle) and at least one second sub-cycle (Y cycle), each first sub-cycle being constituted by steps (i) and (ii) without step (iii), each second sub-cycle being constituted by steps (i) and (iii) without step (ii). In the above embodiments, since the second sub-cycle uses a precursor, densification of the sub-layer formed by the first sub-cycle may not sufficiently progress, and film properties may not be improved. However, the film growth rate is high, and productivity is improved. Thus, depending on the desired film properties and productivity, a precursor can be used in the second sub-cycle.

The number of Z cycles, the number of X cycles, and the number of Y cycles are selected depending on the desired film properties and application. In some embodiments, the thickness of a layer obtained per Z cycle is about 0.05 nm to about 2.0 nm, depending on the number of X cycles. In some embodiments, the number of X cycles and the number of Y cycles can be changed per Z cycle, forming two or more layers so as to modify the film properties in the thickness direction for the intended application and purpose of the oxide film. In some embodiments, the oxide film has a film profile showing a thick periphery and a thin center (i.e., a concave cross section).

In some embodiments, in the first sub-cycle, the oxidizing gas is continuously supplied to the reaction space at a flow rate of about 500 sccm to about 2,000 sccm (e.g., 750 sccm, 1,000 sccm, 1,500 sccm, and a value between any of the foregoing numbers), and in the second sub-cycle, no oxidizing gas is supplied to the reaction space.

In some embodiments, the first RF power is no more than about 0.14 W/cm² (Wattage per unit area of the substrate) (e.g., 0.05 W/cm², 0.07 W/cm², 0.10 W/cm², or a value between any of the foregoing numbers) and the second RF power is no less than about 0.14 W/cm² but no more than about 1.13 W/cm² (e.g., 0.20 W/cm², 0.50 W/cm², 1.00 W/cm², or a value between any of the foregoing numbers). In some embodiments, in addition to the above or in the alternative, the first period of time for applying RF power is about 0.1 seconds to about 1.5 seconds (e.g., 0.2 seconds, 0.5 seconds, 1.0 seconds, or a value between any of the foregoing numbers), and the second period of time for applying RF power is longer than the first period of time. In some embodiments, the first RF power and the second RF power are the same, and the first period of time of applying RF power is shorter than the second period of time for applying RF power. In some embodiments, the first RF power is lower than the second RF power, and the first period of time for applying RF power is the same as the second period of time for applying RF power. Preferably, both RF power and application time are adjusted to effectively inhibit oxidation of the underlying layer, and to obtain a desired final oxide film.

In some embodiments, the sub-layers are continuously formed, wherein the oxide film is constituted by substantially uniform compositions in a thickness direction. Since the first and second sub-cycles are repeated, the uniformity and continuity of compositions constituting the oxide film can be maintained in a thickness direction.

In some embodiments, the first sub-cycle (X cycle) can be performed under the following conditions, although the conditions may vary depending on the type of oxide film:

TABLE 3

(the numbers are approximate)

|  | Preferably | Typically |
|---|---|---|
| Precursor partial pressure in Carrier gas | 2%-20% | 5%-10% |
| Flow rate of carrier gas (continuous) | 500 sccm-4000 sccm | 2000 sccm |
| Flow rate of reactant gas (continuous) | 500 sccm-6000 sccm | 1000-2000 sccm |
| Flow rate of dilution gas (continuous) | 0 sccm-4000 sccm | 2000 sccm |
| Susceptor temperature | 50° C.-400° C. | 75° C.-300° C. |
| Pressure | 200 Pa-600 Pa | 400 Pa |
| RF power (13.56 MHz) | 10 W to 100 W (300-mm tool) (for stable ignition, at least 30 W) | 50 W |
| Precursor supply time | 0.1 sec.-1.0 sec. | 0.2 sec |
| Purge time after precursor pulse | 0.1 sec.-2.0 sec. | 0.3 sec |
| RF plasma exciting time | 0.1 sec.-1.0 sec. | 0.2 sec or less |
| Purge time after RF application | 0 sec.-0.5 sec. | 0.1 sec |

In some embodiments, the second sub-cycle (Y cycle) can be performed under the following conditions, although the conditions may vary depending on the type of oxide film:

TABLE 4

(the numbers are approximate)

|  | Preferably | Typically |
|---|---|---|
| Precursor partial pressure in Carrier gas | 2%-20% | 5%-10% |
| Flow rate of carrier gas (continuous) | 500 sccm-4000 sccm | 2000 sccm |
| Flow rate of reactant gas (continuous) | N/A | N/A |
| Flow rate of dilution gas (continuous) | 0 sccm-4000 sccm | 3000 sccm |
| Susceptor temperature | 50° C.-400° C. | 75° C.-300° C. |
| Pressure | 200 Pa-600 Pa | 400 Pa |
| RF power (13.56 MHz) | 100 W to 800 W (300-mm tool) | 500 W |
| Precursor supply time | 0.1 sec.-1.0 sec. | 0.2 sec |
| Purge time after precursor pulse | 0.1 sec.-2.0 sec. | 0.3 sec |
| RF plasma exciting time | 0.1 sec.-5.0 sec. | 0.2 sec or more |
| Purge time after RF application | 0 sec.-0.5 sec. (*) | 0.1 sec |

In the above, the symbol * denotes that a transition period for switching from the second sub-cycle to the first sub-cycle functions necessarily as a mechanism of purging.

In some embodiments, the first sub-cycle and the second sub-cycle can continuously be performed by changing RF power application and dilution gas flow only. In other embodiments, the first sub-cycle and the second sub-cycle can continuously be performed by changing not only RF power application and dilution gas flow but also other gas flow.

Figure 4:
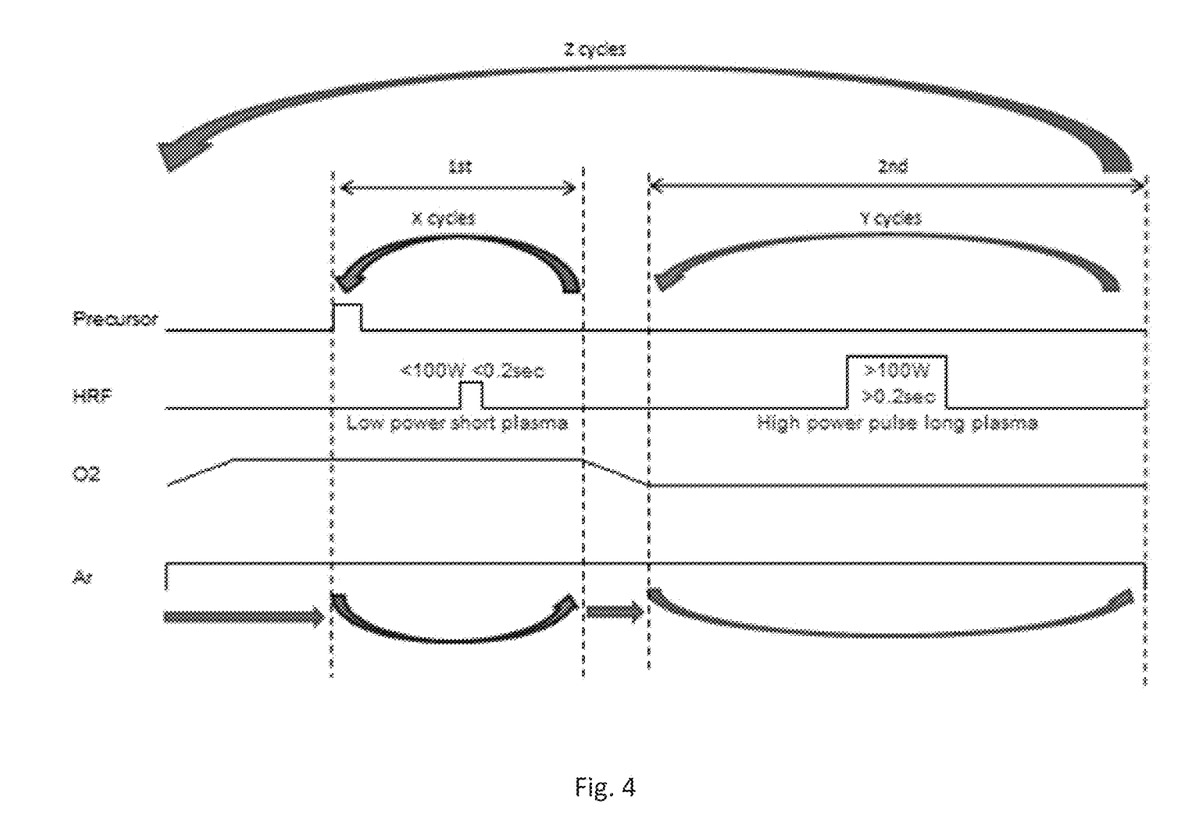
FIG. 4 illustrates the sequence constituted by X cycles, Y cycles, and Z cycles according to an embodiment of the present invention.

FIG. 4 illustrates the sequence constituted by X cycles, Y cycles, and Z cycles according to an embodiment of the present invention. In this embodiment, in Y cycles, no precursor is supplied, and no oxidizing gas is supplied, but higher RF power is applied for a longer period of time than in X cycles. Since the process conditions are different between X cycles and Y cycles, there are transition periods therebetween, which are typically 0.1 seconds or 0.2 seconds. In some embodiments, $O_2$ can be supplied in pulses in X cycles which do not overlap pulses of the precursor. In some embodiments, the plasma is generated in the reaction space by applying RF power to the reaction space (in-situ plasma). In some embodiments, a remote plasma unit can be used for exciting the reactant gas and supplying a plasma to the reaction space.

Figure 6:
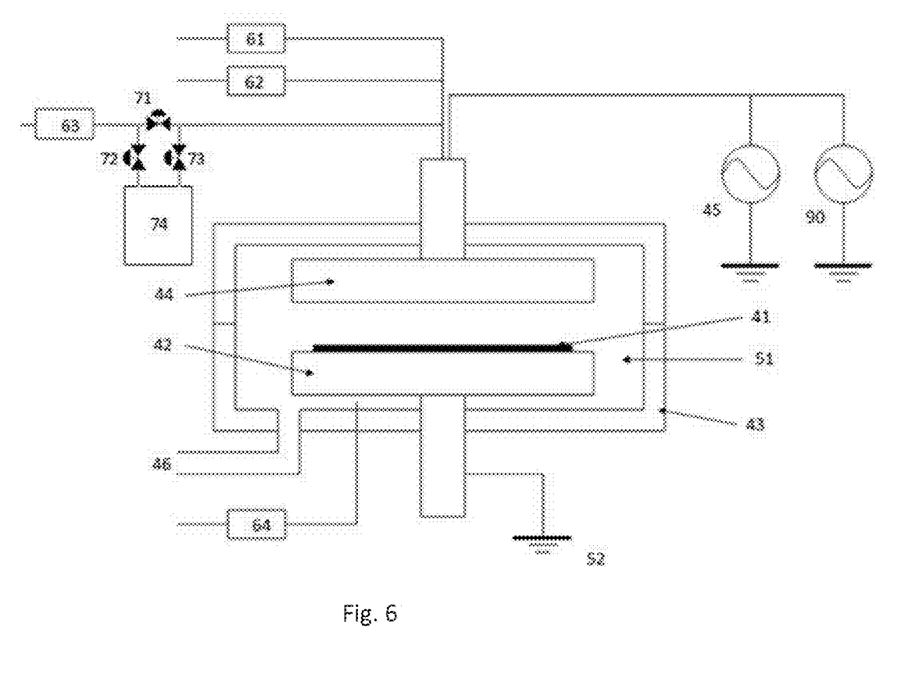
FIG. 6 is a schematic representation of a PEALD apparatus for depositing an oxide film, usable in an embodiment of the present invention.

FIG. 6 is a schematic view of a PEALD apparatus, desirably in conjunction with controls programmed to conduct the sequences described herein, usable in some embodiments of the present invention. In this figure, by providing a pair of electrically conductive flat-plate electrodes 44, 42 in parallel and facing each other in the interior 51 of a reaction chamber 43, applying HRF power (13.56 MHz or 27 MHz) 45 and LRF power of 5 MHz or less (400 kHz~500 kHz as necessary) 90 to one side, and electrically grounding 52 the other side, a plasma is excited between the electrodes. A temperature regulator is provided in a lower stage 42 (the lower electrode), and a temperature of a substrate 41 placed thereon is kept constant at a given temperature. The upper electrode 44 serves as a shower plate as well, and reaction gas and rare gas are introduced into the reaction chamber 43 through a as flow controller 63, pulse flow control valves 71-73, and the shower plate. In this embodiment, the precursor is stored as a liquid in a bottle 74 equipped with a heater. The rare gas can continuously flow into the reaction chamber 43 either (a) through the valve 71 when the valves 72 and 73 are closed, or (b) through the valve 72, the bottle 74, and the valve 73 when the valve 71 is closed. In (b), the rare gas carries the precursor and flows into the reaction chamber 43 together with the precursor. In (a), the rare gas alone flows into the reaction chamber 43. By the above mechanism with operation of the valves, the rare gas can be fed continuously while pulsing the feed of the precursor. Additionally, in the reaction chamber 43, an exhaust pipe 46 is provided, through which gas in the interior 51 of the reaction chamber 43 is exhausted. Additionally, the reaction chamber 43 is provided with a seal gas flow controller 64 to introduce seal gas into the interior 51 of the reaction chamber 43 (a separation plate for separating a reaction zone and a transfer zone in the interior of the reaction chamber is omitted from this figure). For cyclic PECVD, the same apparatus can be used.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics, and gas flow controllers or valves of the reactor, as will be appreciated by the skilled artisan.

EXAMPLES

Example 1

Figure 2A:
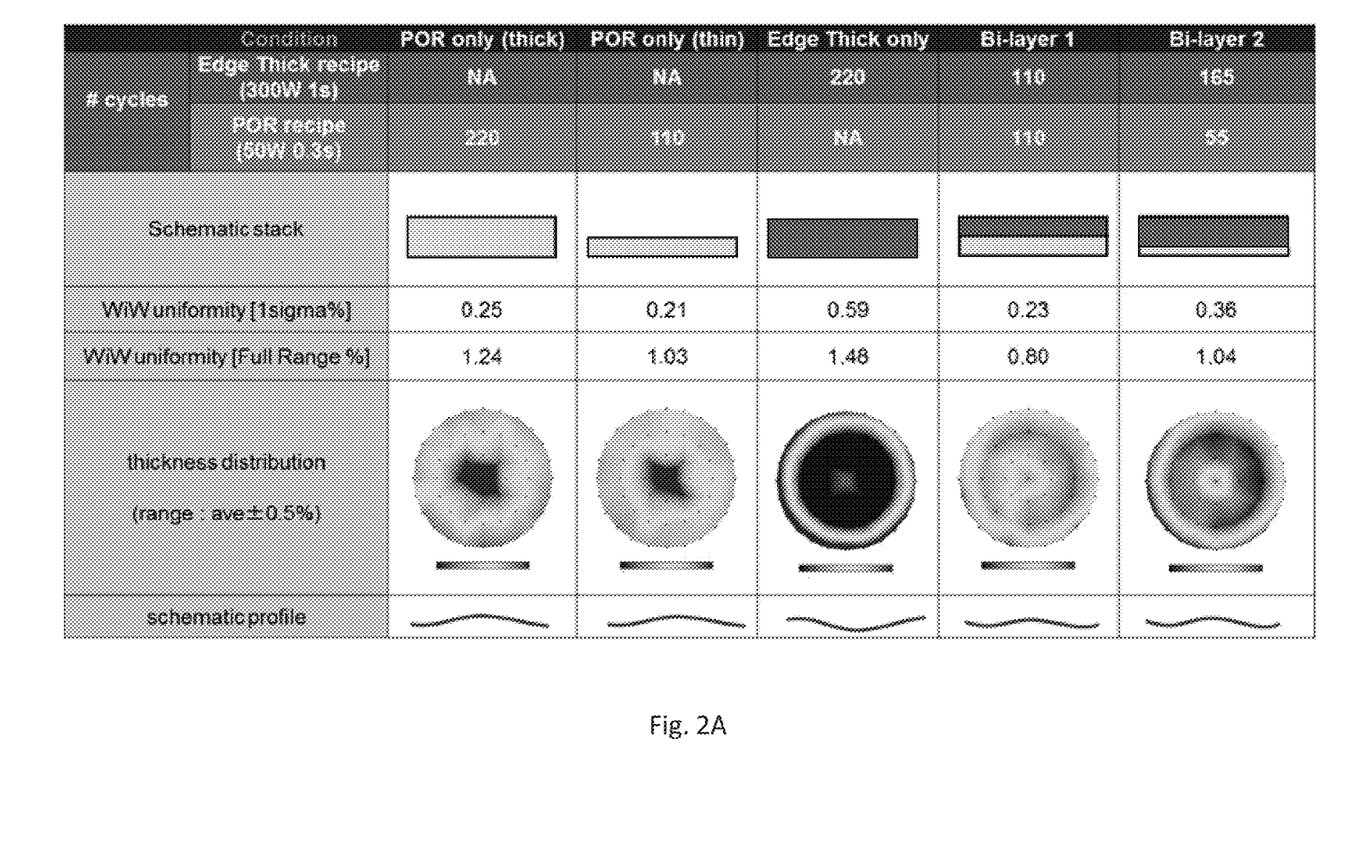
FIG. 2A shows results of Examples where the number of cycles in the "Edge Thick" recipe and the number of cycles in the POR recipe for plasma-enhanced atomic layer deposition (PEALD) were changed.
Figure 2B:
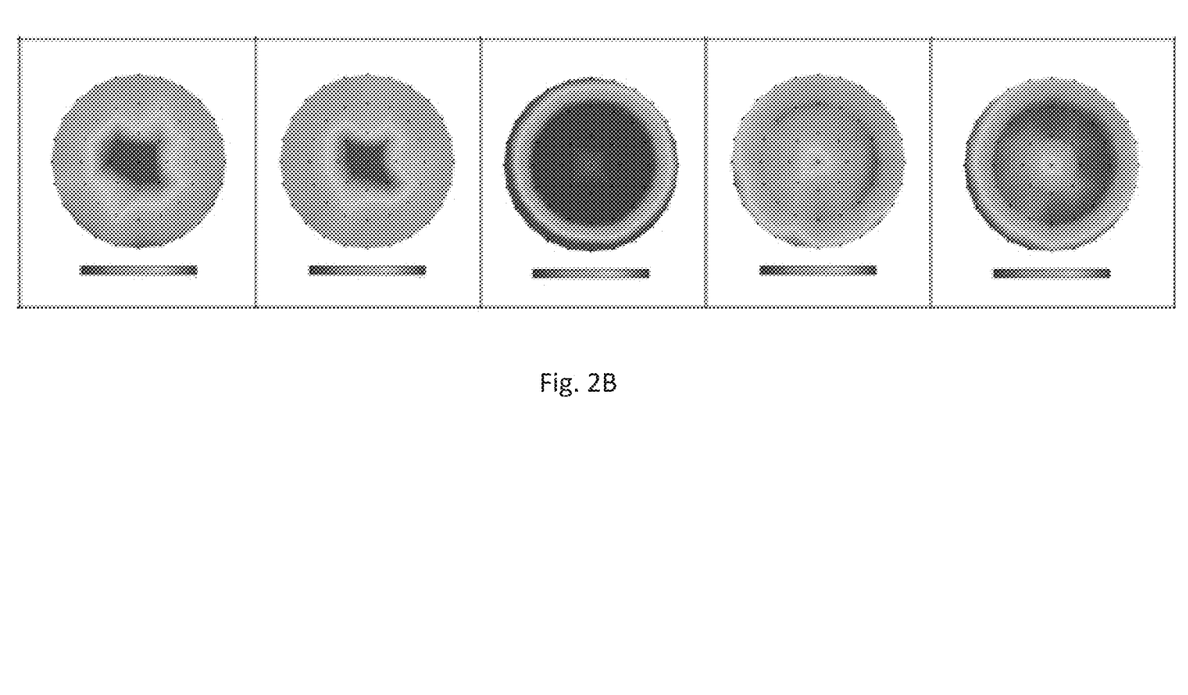
FIG. 2B shows color versions of images of thin-film thickness profile measurement by 2D color map analysis of films shown in FIG. 2A.

A 300-mm Si substrate having a photoresist pattern formed thereon was loaded in an apparatus illustrated in FIG. 6 and an oxide film was deposited by PEALD under conditions shown in Table 5 below. The results are shown in FIG. 2A. In this application, a target film was required to have a film profile showing a relatively high thickness along the periphery of the substrate. In the table, the term "POR only (thick)" ("POR" refers to "process of reference film—Center Thick") refers to a PEALD process using low-RF power oxygen plasma only, until a thickness of a film reached about 20 nm. The term "POR only (thin)" refers to a PEALD process using low-RF power oxygen plasma only, until the thickness of a film reached about 10 nm. The term "Edge Thick only" refers to a PEALD process using high-RF power oxygen plasma only, until the thickness of a film reached about 20 nm. The term "Bi-layer 1" refers to a PEALD process using low-RF power oxygen plasma until the thickness of a film reached about 10 nm, and then using high-RF power oxygen plasma until the thickness of the film reached about 20 nm. The term "Bi-layer 2" refers to a PEALD process using low-RF power oxygen plasma until the thickness of as film reached about 3 nm, and then using high-RF power oxygen plasma until the thickness of the film reached about 20 nm. The "high-RF power" refers to application of RF power at 3,000 W for 1.0 seconds, whereas the "low-RF power" refers to application of power at 50 W for 0.3 seconds. The term "Edge Thick recipe" refers to application of high RF power, whereas the term "POR recipe" refers to application of low RF power. The term "WiW uniformity [1sigma %]" ("WiW" refers to "within wafer") refers to in-plane film uniformity at 10% (STDEV/Ave× 100), whereas the term "WiW uniformity [Full Range %]" refers to in-plane film uniformity evaluated by ((Max−Min)/ Ave×100) in the entire range. The "thickness distribution" shows grayscale images of thin-film thickness profile measurement by 2D color map analysis of the films. Since the grayscale images do not provide information as to whether the dark area represents a thick area or a thin area, FIG. 2B shows color versions of the images of thin-film thickness profile measurement by 2D color map analysis of films shown in FIG. 2A. In the images, an area in red represents an area having a relatively higher thickness, whereas an area in blue represents an area having a relatively lower thickness. The "schematic profile" shows schematic contours of the films when taken in cross sections.

TABLE 5

| Condition | | POR recipe | Edge Thick recipe |
|---|---|---|---|
| Precursor | | BDEAS | BDEAS |
| Precursor Bottle Temp | [deg C.] | 35.0 | 35.0 |
| Carrier Ar | [sccm] | 2000 | 2000 |
| $O_2$ | [sccm] | 4000 | 4000 |
| Seal He | [sccm] | 200 | 200 |
| RC Press | [Pa] | 400 | 400 |
| HRF | [W] | 50 | 500 |
| SUS temp | [deg C.] | 75 | 75 |
| SHD temp | [deg C.] | 75 | 75 |
| Wall Temp | [deg C.] | 75 | 75 |
| Gap | [mm] | 7.5 | 7.5 |
| Cycle Time [sec] | Source-Feed | 0.2 | 0.2 |
| | Source-Purge | 0.3 | 0.3 |
| | RF-ON | 0.2 | 1.0 |
| | Post-Purge | 0.1 | 0.1 |

As can be seen from FIGS. 2A and 2B, the high-RF power application contributed to the film profile showing a thick periphery (roughly a concave profile) as shown in "Edge Thick only", whereas the low-RF power application contributed to the film profile showing a thick center (roughly a convex profile) as shown in "FOR only (thick)" and "POR only (thin)". When combining the high-RF power application and the low-RF power application as shown in "Bi-layer 1" and "Bi-layer 2", the film profiles show both a thick center and a thick periphery (e.g., overlaying a concave film on top of a convex film), which satisfy the requirement of a thick periphery.

Table 6 below shows results of oxidation of the underlying photoresist in each example. The term "PR width" refers to the width of the photoresist prior to film deposition, the term "Depo thick" refers to the thickness of film deposited on the photoresist, and the term "CD" refers to critical dimensions (i.e., the width of film-covered photoresist, i.e., the sum of the thickness of the oxide film formed on one sidewall of the photoresist, the width of the photoresist, and the thickness of the oxide film formed on the other sidewall of the photoresist taken along a horizontal line in a cross section). Although the high-RF power application contributed to the film profile showing a thick periphery as shown in "Edge Thick only" in Table 5, the CD was reduced to 61 nm as compared with 68 nm for "POR only (thick)" and "Bi-layer 1" in Table 6. This indicates that when the high-RF power application was used, the photoresist was eroded by oxidation caused by an oxygen plasma, and due to the continuous ion bombardment, the width of the photoresist was reduced. In contrast, when the low-RF power application was used at the beginning of deposition so as to form a protective oxide film, the protective film protected the photoresist from the oxidation and ion bombardment, and an oxide film was deposited thereon without reducing the width of the photoresist. When the thickness of the protective film was thin ("Bi-layer 2"), the CD was slightly reduced (the CD was 67 nm), but the reduction was not significant. Both "Bi-layer 1" and "Bi-layer 2" showed the CD which is equivalent to that of "POR only (thick)".

TABLE 6

| | POR only (thick) | Edge Thick only | Bi-layer 1 | Bi-layer 2 [nm] |
|---|---|---|---|---|
| PR width | 30 | 30 | 30 | 30 |
| Depo thick | 20 | 20 | 20 | 20 |
| CD | 68 | 61 | 68 | 67 |

Figure 3:
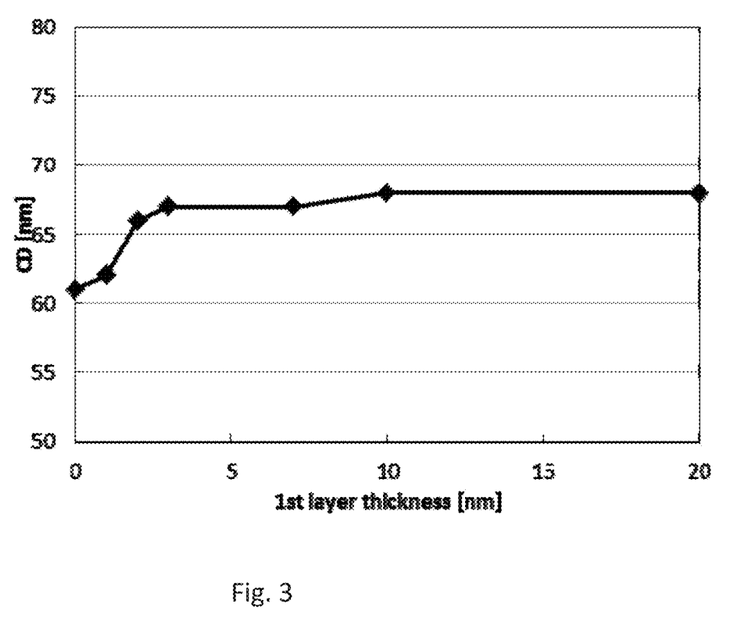
FIG. 3 is a graph showing the relationship between CD (critical dimensions) and thickness of a protective oxide film according to embodiments of the present invention.

FIG. 3 is a graph showing the relationship between CD (critical dimensions) and thickness of a protective oxide film, including the results shown in Table 6. As shown in FIG. 3, when the thickness of the protective oxide film is 2 nm, 3 nm, or 7 nm or more, oxidation of the underlying layer can effectively be inhibited. However, the inhibition of oxidation of the underlying layer reaches a plateau when the thickness of the protective oxide film 10 nm or more. Thus, once the protective oxide film has a thickness effective to inhibit oxidation of the underlying layer, the thickness of the protective oxide film can be selected depending on the desired film profile of the target oxide film.

The film profile can be controlled by manipulating RF power and the duration of RF application. When using relatively high RF power for a relatively longer period, the resultant film profile shows a thick periphery (a concave profile), whereas when using relatively low RF power for a relatively shorter period, the resultant film profile shows a thick center (a convex profile). However, when the high RF power is used for a concave profile, the underlying layer such as a photoresist is oxidized and eroded, degrading CD properties. On the other hand, when the low RF power is used, it is difficult to obtain a concave profile even if oxidation of the underlying layer can be suppressed. By using the low-RF power application and the high-RF power application in this sequence, a film having a concave profile can be deposited without causing oxidation of the underlying layer, i.e., without degradation of CD properties.

Example 2

Oxide films were deposited on substrates by PEALD under conditions shown in Table 7 below using the apparatus illustrated in FIG. 6. The "Low Power SiO" refers to a SiO film deposited using the X cycles with low RF power in shown in FIG. 4. The "High Power SiO" refers to a SiO film deposited using the X cycles with high RF power in place of low RF power shown in FIG. 4 (modified X cycles). The "Low Power HQ SiO" refers to a SiO film deposited using the Z cycles which include the X cycles and the Y cycles shown in FIG. 4. The resultant films were subjected to a wet etching test.

TABLE 7

| Conditions | | Low Power SiO | High Power SiO | Low Power HQ SiO X | Y |
|---|---|---|---|---|---|
| Precursor | | BDEAS | BDEAS | BDEAS | N/A |
| Precursor Bottle Temp | [deg C.] | 50 | 50 | 50 | 50 |
| Carrier Ar | [sccm] | 2000 | 2000 | 2000 | 2000 |
| O2 | [sccm] | 4000 | 4000 | 3000 | N/A |
| Seal He | [sccm] | 200 | 200 | 1800 | 1800 |
| RC Press | [Pa] | 400 | 400 | 333 | 333 |
| HRF | [W] | 100 | 500 | 100 | 500 |
| SUS temp | [deg C.] | 75 | 75 | 300 | 300 |

TABLE 7-continued

| Conditions | | Low Power SiO | High Power SiO | Low Power HQ SiO X | Y |
|---|---|---|---|---|---|
| SHD temp | [deg C.] | 75 | 75 | 150 | 150 |
| Wall Temp | [deg C.] | 75 | 75 | 130 | 130 |
| Gap | [mm] | 7.5 | 7.5 | 7.5 | 7.5 |
| Cycle Time [sec] | Source-Feed | 0.2 | 0.2 | 0.2 | N/A |
| | Source-Purge | 0.3 | 0.3 | 0.3 | N/A |
| | RF-ON | 1.0 | 1.0 | 0.2 | 1.2 |
| | Post-Purge | 0.1 | 0.1 | 0.1 | 0.1 |

Figure 5:
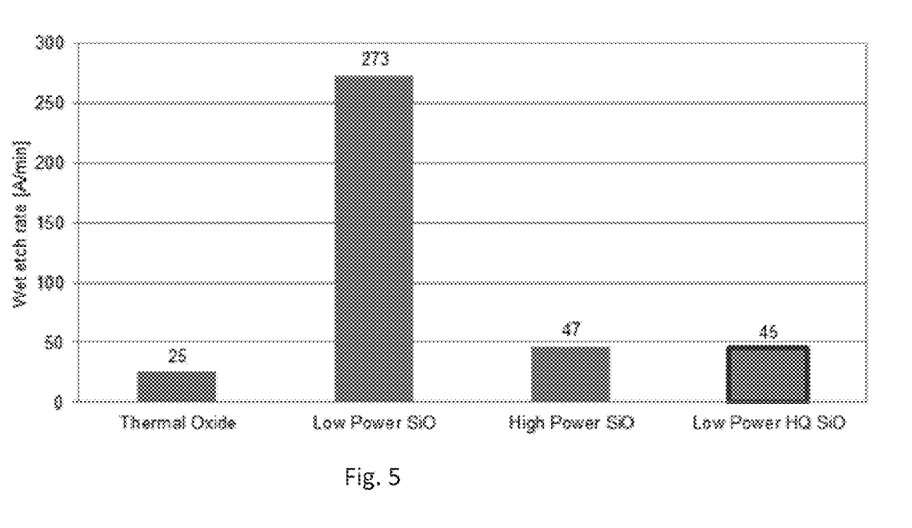
FIG. 5 is a graph showing wet etch rates of the films obtained in the Examples.

The results are shown in FIG. 5. The "Wet etch rate" refers to a wet etch rate using DHF (at 1:100). As shown in FIG. 5, when the low-RF power cycles (the X cycles) were used, the resultant SiO film ("Low Power SiO") did not have good resistance to wet etching. When the high-RF power cycles (the modified X cycles) were used, the resultant SiO film ("High Power SiO") had good resistance to wet etching. Surprisingly, when a combination of the low-RF power cycles and the high-RF power non-oxidation cycles (the Z cycles was used, the resultant SiO film ("Low Power HQ SiO") exhibited excellent resistance to wet etching. Further, since the Z cycles constituted by the X cycles and the Y cycles were repeated, the resultant SiO film was expected to have substantially uniform compositions throughout the film particularly in the thickness direction. That is, the Y cycles were not a post-deposition surface treatment but were a part of the cycles.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming an oxide film by plasma-assisted cyclic processing, comprising:
   (i) supplying a precursor to a reaction space wherein a substrate is placed;
   (ii) applying a first RF power to the reaction space for a first period of time without supplying a precursor; and
   (iii) applying a second RF power to the reaction space for a second period of time without supplying a precursor, wherein the first RF power is lower than the second RF power, and/or the first period of time is shorter than the second period of time,
   wherein the first RF power is no more than 0.14 W/cm$^2$ (Wattage per unit area of the substrate), and the second RF power is no less than 0.14 W/cm$^2$ but no more than 1.13 W/cm$^2$,
   wherein the oxide film is constituted by a first oxide layer and a second oxide layer, wherein steps (i) and (ii) without step (iii) constitute a first cycle, and by repeating the first cycle, the first oxide layer is formed on the substrate, and wherein steps (i) and (iii) without step (ii) constitute a second cycle, and by repeating the second cycle, the second oxide layer is formed on top of the first oxide film, said precursors used in the first and second cycles being the same,
   wherein step (ii) is controlled so that the first oxide layer has a film profile showing a thickness of the first oxide layer which is thicker at a center of the first oxide layer than along a periphery of the first oxide layer, and step (iii) is controlled so that the second oxide layer has a film profile showing a thickness of the second oxide layer which is thicker along a periphery of the second oxide layer than at a center of the second oxide layer.

2. The method according to claim 1, wherein the first cycle is repeated until the first oxide layer has a thickness of about 2 nm or more.

3. The method according to claim 2, wherein the thickness of the first oxide layer is 20 nm or less.

4. The method according to claim 1, wherein an oxidizing gas is continuously supplied to the reaction chamber throughout step (i), step (ii), and step (iii).

5. The method according to claim 1, wherein the first oxide layer and the second oxide layer are continuously formed, wherein the oxide film is constituted by substantially uniform compositions in a thickness direction.

6. A method for forming an oxide film by plasma-assisted cyclic processing, comprising:
(i) supplying a precursor to a reaction space wherein a substrate is placed;
(ii) applying a first RF power to the reaction space for a first period of time without supplying a precursor; and
(iii) applying a second RF power to the reaction space for a second period of time without supplying a precursor, wherein the first RF power is lower than the second RF power, and/or the first period of time is shorter than the second period of time,
wherein the oxide film is constituted by a first oxide layer and a second oxide layer, wherein steps (i) and (ii) without step (iii) constitute a first cycle, and by repeating the first cycle, the first oxide layer is formed on the substrate, and wherein steps (i) and (iii) without step (ii) constitute a second cycle, and by repeating the second cycle, the second oxide layer is formed on top of the first oxide film, said precursors used in the first and second cycles being the same,
wherein the second oxide layer is thicker than the first oxide layer, and the oxide film has a film profile showing a thickness of the oxide film which is thicker at a center and along a periphery of the oxide film than in an area between the center and the periphery.

7. The method according to claim 6, wherein the first RF power is no more than 0.14 W/cm² (Wattage per unit area of the substrate), and the second RF power is no less than 0.14 W/cm² but no more than 1.13 W/cm².

8. A method for forming an oxide film by plasma-assisted cyclic processing, comprising:
(i) supplying a precursor to a reaction space wherein a substrate is placed;
(ii) applying a first RF power to the reaction space for a first period of time without supplying a precursor; and
(iii) applying a second RF power to the reaction space for a second period of time without supplying a precursor, wherein the first RF power is lower than the second RF power, or the first RF power is lower than the second RF power and the first period of time is shorter than the second period of time,
wherein the first RF power is no more than 0.14 W/cm² (Wattage per unit area of the substrate), and the second RF power is no less than 0.14 W/cm² but no more than 1.13 W/cm², the first RF power and the second RF power having a same frequency,
wherein the oxide film is constituted by multiple sub-oxide layers, wherein steps (i), (ii), and (iii) constitute a cycle, and by repeating the cycle, the multiple sub-oxide layers are formed on the substrate, wherein in step (ii), an oxidizing gas is supplied, and in step (iii), no oxidizing gas is supplied,
wherein the cycle is constituted by at least one first sub-cycle and at least one second sub-cycle, each first sub-cycle being constituted by steps (i) and (ii) without step (iii), each second sub-cycle being constituted by step (iii) without steps (i) and (ii).

9. The method according to claim 8, wherein each first sub-cycle deposits a sub-layer constituting the oxide film, and each second sub-cycle deposits no sub-layer.

10. The method according to claim 8, wherein in the first sub-cycle, the oxidizing gas is continuously supplied to the reaction space at a flow rate of 500 sccm to 2,000 sccm, and in the second sub-cycle, no oxidizing gas is supplied to the reaction space.

11. The method according to claim 8, wherein the first period of time for applying RF power is 0.1 seconds to 1.5 seconds, and the second period of time for applying RF power is longer than the first period of time.

12. The method according to claim 9, wherein the sub-layers are continuously formed, wherein the oxide film is constituted by substantially uniform compositions in a thickness direction.

13. The method according to claim 8, wherein steps (i) to (iii) are conducted at a temperature of 50° C. to 400° C., and the first and second RF powers are charged between electrodes which are distanced by 7 mm to 15 mm, between which the substrate is placed.

14. The method according to claim 8, wherein the plasma-assisted cyclic processing is plasma-enhanced atomic layer deposition (PEALD).

* * * * *